United States Patent
Cho et al.

(10) Patent No.: US 7,560,340 B2
(45) Date of Patent: Jul. 14, 2009

(54) METHOD OF MANUFACTURING FLASH MEMORY DEVICE

(75) Inventors: Whee Won Cho, Cheongju-si (KR); Seung Hee Hong, Seoul (KR); Seong Hwan Myung, Yeoju-gun (KR); Eun Soo Kim, Incheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 400 days.

(21) Appl. No.: 11/567,218

(22) Filed: Dec. 6, 2006

(65) Prior Publication Data

US 2008/0003742 A1    Jan. 3, 2008

(30) Foreign Application Priority Data

Jun. 29, 2006    (KR) .................. 10-2006-0059517

(51) Int. Cl.
    *H01L 21/336* (2006.01)
(52) U.S. Cl. ................ 438/259; 438/260; 257/E21.682
(58) Field of Classification Search ................ 438/259, 438/260; 257/E21.682
    See application file for complete search history.

(56) References Cited

U.S. PATENT DOCUMENTS 6,495,467 B2 * 12/2002 Shin et al. .................... 438/706
6,682,977 B2 * 1/2004 Chang ........................ 438/257

FOREIGN PATENT DOCUMENTS

| KR | 10-2002-0091984 A | 12/2002 |
| KR | 10-2005-0002246 A | 1/2005 |
| KR | 10-2006-0006331 A | 1/2006 |

* cited by examiner

*Primary Examiner*—Chandra Chaudhari
(74) *Attorney, Agent, or Firm*—Townsend and Townsend and Crew LLP

(57) ABSTRACT

A method of manufacturing flash memory devices increases a coupling ratio by increasing the height of a floating gate externally projecting from an isolation layer. A portion of the isolation layer between the floating gates is etched so that a control gate to be formed subsequently is located between the floating gates. Accordingly, an interference phenomenon can be reduced.

8 Claims, 3 Drawing Sheets

US 7,560,340 B2

METHOD OF MANUFACTURING FLASH MEMORY DEVICE

BACKGROUND OF THE INVENTION

The present invention relates, in general, to flash memory devices and, more particularly, to a method of manufacturing flash memory devices, wherein it can reduce interference between floating gates.

In a NAND type flash memory device, a plurality of cells for storing data therein are connected in series to form one string. A drain selection transistor and a source selection transistor are formed between the cell string and the drain and between the cell string and the source, respectively. Each cell of the NAND flash memory device constructed above is formed by forming a gate in which a tunnel oxide layer, a floating gate, a dielectric layer and a control gate are laminated on a predetermined region of a semiconductor substrate and forming a junction on both sides of the gate.

In the NAND flash memory device, the status of a cell is influenced by the operations of neighboring cells. It is thus very important to keep constant the status of the cell. A phenomenon in which the status of a cell is changed due to the operations of neighboring cells (more particularly, a program operation) is referred to as an "interference phenomenon". In other words, the term "interference phenomenon" refers to a phenomenon in which if a first cell to be programmed and a second cell adjacent to the first cell are programmed, a threshold voltage higher than that of the first cell when the first cell is read is read due to a capacitance effect caused by variation in the charge of a floating gate of the second cell. Though the charge of the floating gate of the read cell is not changed, the status of an actual cell looks distorted due to the change in the status of an adjacent cell. The status of the cell is varied because of the interference phenomenon. It results in an increased defective ratio and a decreased yield. Accordingly, to minimize the interference phenomenon is effective in keeping constant the status of the cell.

Meanwhile, in a general manufacture process of a NAND flash memory device, portions of an isolation layer and a floating gate are formed using a Self-Aligned Shallow Trench Isolation (SA-STI) process. The process will be described below in short with reference to FIG. 1.

A tunnel oxide layer 11 and a first polysilicon layer 12 are formed on a semiconductor substrate 10. Predetermined regions of the first polysilicon layer 12 and the tunnel oxide layer 11 are etched. The semiconductor substrate 10 is etched to a depth, forming trenches 13. The trenches are gap-filled with an insulating layer. A polishing process is performed to form isolation layers 14. Thereafter, a first oxide layer 15, a nitride layer 16 and a second oxide layer 17 are sequentially formed, completing a dielectric layer 18.

If the flash memory device is fabricated by the SA-STI process as described above, the isolation layer is formed between the first polysilicon layer serving as the floating gate and an adjacent first polysilicon layer. Accordingly, interference may occur between the first polysilicon layers.

FIG. 2 is a graph showing the relationship between the interference phenomenon depending on a height and distance between the floating gates, and the coupling ratio.

From FIG. 2, it can be seen that the interference between the gates is proportional to the distance between the floating gates and the height of the floating gate. In other words, if the distance between the floating gates is far and the height of the floating gate is decreased, the interference is decreased. However, if the height of the floating gate is reduced, the interfacial area of the floating gate and the control gate is reduced and the coupling ratio is reduced.

SUMMARY OF THE INVENTION

The present invention relates to a method of manufacturing a flash memory device, in which the coupling ratio can be increased by increasing the height of a floating gate externally projecting from an isolation layer, and a portion of the isolation layer between the floating gates is etched so that a control gate to be formed subsequently is located between the floating gates, thereby reducing an interference phenomenon.

According to an embodiment of the present invention, there is provided a method of manufacturing a flash memory device, including forming a tunnel oxide layer, and a conductive layer for a floating gate on a semiconductor substrate, and etching a portion of the conductive layer, the tunnel oxide layer and the semiconductor substrate to form trenches, gap-filling the trenches with an insulating layer, thus forming isolation layers, and polishing the isolation layers so that a top surface of the conductive layer is exposed, etching the isolation layers such that an effective field oxide height (EFH) is lowered up to a top surface of the tunnel oxide layer, forming sidewalls on sidewall parts of the conductive layer, and etching the isolation layers up to a region below the tunnel oxide layer using the sidewall parts as masks, stripping the sidewall parts and performing an etch process in order to widen an opening part of each isolation layer and increase the height of the sidewalls of the exposed conductive layer, and forming a dielectric layer and a second conductive layer for a control gate on the entire surface.

DETAILED DESCRIPTION OF EMBODIMENTS

Now, specific embodiments according to the present invention will be described with reference to the accompanying drawings.

FIGS. 3 to 7 are cross-sectional views of flash memory devices for illustrating a method of manufacturing the device according to an embodiment of the present invention.

Figure 1:
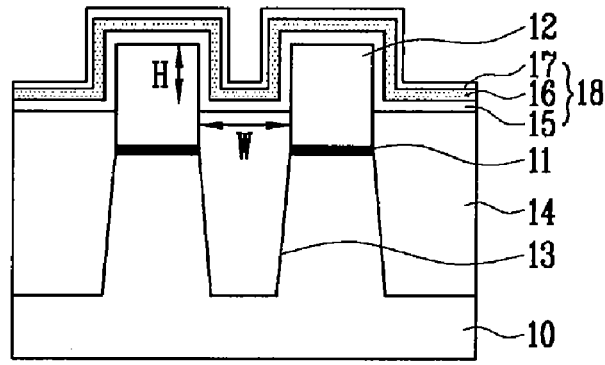
FIG. 1 is a cross-sectional view of a flash memory device for illustrating a conventional method of manufacturing the device.
Figure 2:
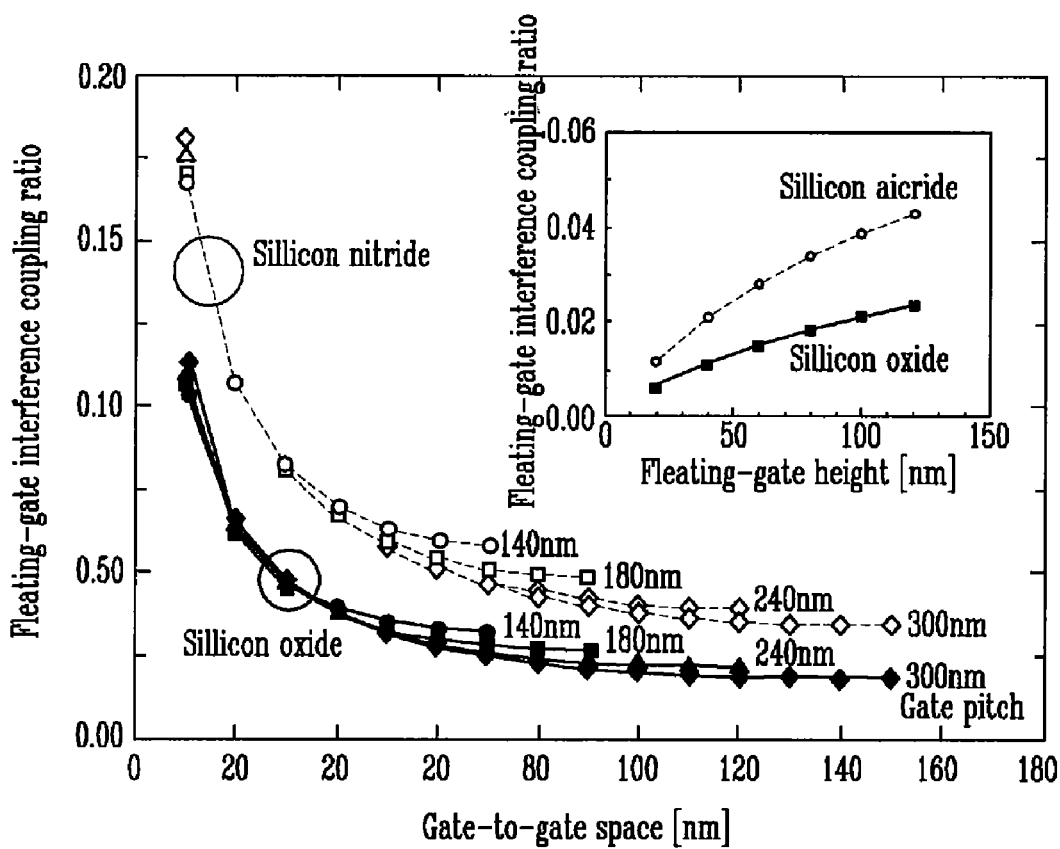
FIG. 2 is a graph showing the relationship between the interference phenomenon depending on a height and distance between the floating gates, and the coupling ratio.
Figure 3:
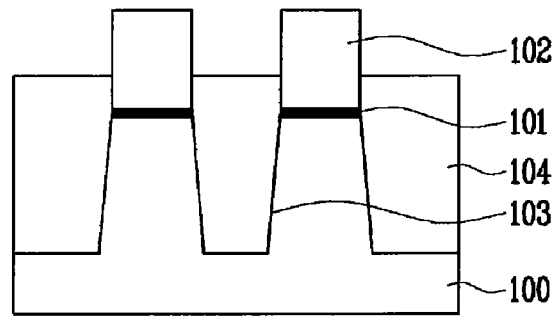
FIGS. 3 to 7 are cross-sectional views of flash memory devices for illustrating a method of manufacturing the device according to an embodiment of the present invention.

Referring to FIG. 3, a tunnel oxide layer 101 and a conductive layer 102 for a floating gate are sequentially formed on a semiconductor substrate 100. In some embodiments, the conductive layer 102 is formed using a polysilicon layer. The conductive layer 102 and the tunnel oxide layer 101 are selectively etched by an etch process using an isolation mask. The semiconductor substrate 100 is etched using the selectively etched conductive layer 102 as a mask, thus forming trenches 103.

An insulating layer (for example, a High Density Plasma (HDP) oxide layer) is formed on the entire surface so that the trenches 103 are gap-filled. The insulating layer is polished (for example, by performing a chemical mechanical planarization or CMP process) so that a top surface of the conductive layer 102 is exposed, thereby forming isolation layers 104 within the trenches 103.

A wet etch process is then performed in order to lower an effective field oxide height (EFH) of the isolation layer 104. At the time, the EFH is lowered up to a top surface of the tunnel oxide layer 101 so that the tunnel oxide layer 101 is not attached at the time of the wet etch process.

Figure 4:
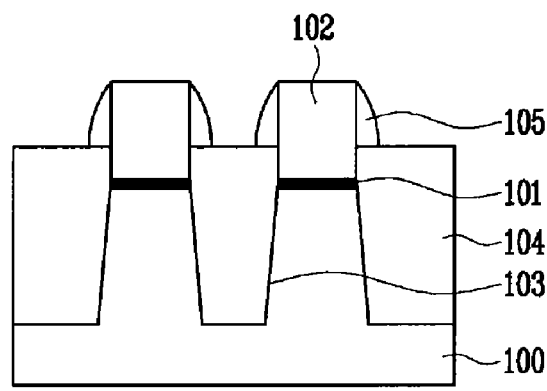

Referring to FIG. 4, an amorphous carbon layer is deposited on the entire surface including the conductive layer 102. The amorphous carbon layer is etched in such a way that it remains only on sidewalls of the conductive layer 102, thus forming sidewall parts 105.

Figure 5:
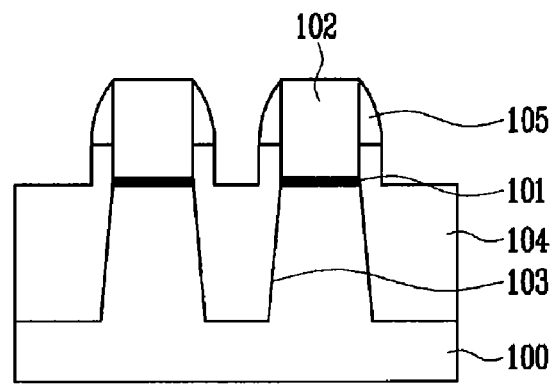

Referring to FIG. 5, the isolation layers 104 are partially etched using the conductive layer 102 and the sidewall parts 105 as masks, so that they have an irregular top surface. In some embodiments, the isolation layers 104 are etched to a thickness of about 50 Å to about 1000 Å.

Figure 6:
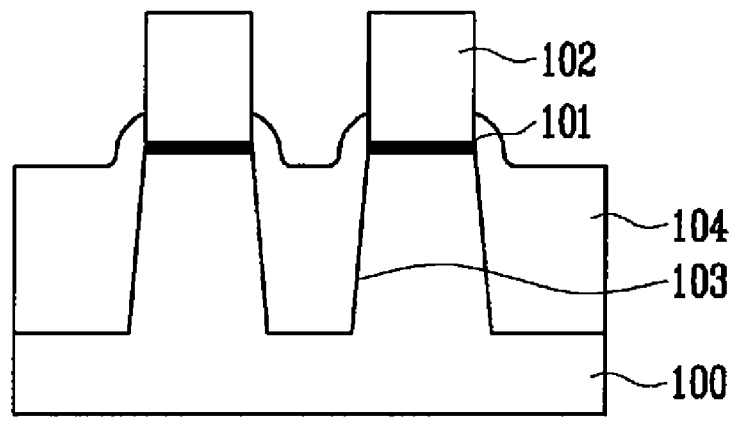

Referring to FIG. 6, the sidewall parts 105 are stripped by an etch process. In the etch process, the sidewall parts 105 may be stripped using dry etch or wet etch. An etch process is then performed in order to widen an opening part of the isolation layer 104. By etching the top surfaces of the isolation layers 104 remaining on the sidewalls of the conductive layer 102, the height of the sidewalls of the conductive layer 102 is increased. Accordingly, the coupling ratio of the device is increased.

Figure 7:
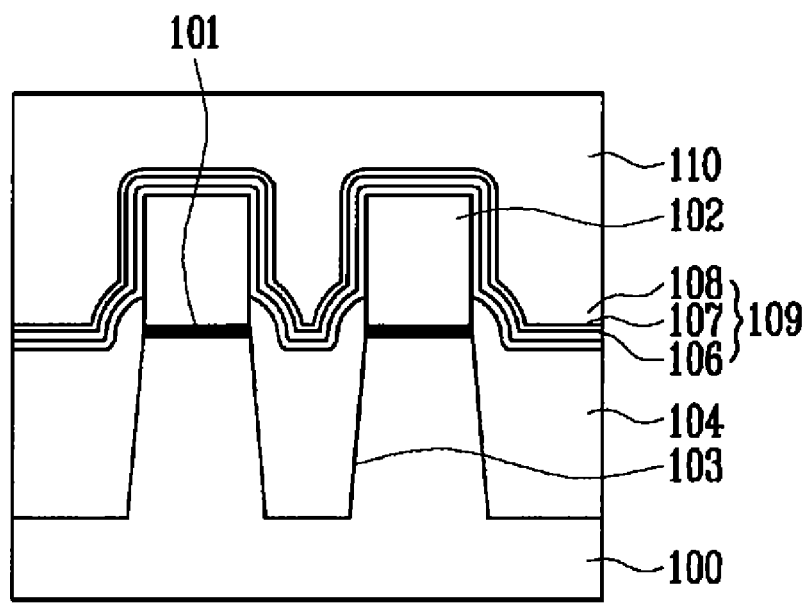

Referring to FIG. 7, a dielectric layer 109 is formed on the entire surface including the conductive layer 102. The dielectric layer 109 may have an ONO structure in which the first oxide layer 106, the nitride layer 107 and the second oxide layer 108 are sequentially laminated. A conductive layer 110 for a control gate is formed on the dielectric layer 109. The conductive layer 110 may be formed using a polysilicon layer. Accordingly, the dielectric layer 109 and the conductive layer 110 are fully gap-filled between the conductive layers 102, thereby separating the conductive layers 102 from each other. Accordingly, interference occurring between the conductive layers 102 can be reduced.

As described above, the present invention has the following advantages.

The dielectric layer and the second polysilicon layer are fully gap-filled between the polysilicon layers. It is therefore possible to reduce the interference phenomenon occurring between the first polysilicon layers.

Furthermore, since the interference phenomenon is reduced, the distributions of the threshold voltage (Vt) in each string of a cell can be improved.

In addition, at the time of the etch process of the isolation layers, the etch selectivity of the first polysilicon layer is high in order to minimize the loss of the first polysilicon layer. It is therefore possible to effectively secure the coupling ratio.

Although the foregoing description has been made with reference to the various embodiments, it is to be understood that changes and modifications of the present invention may be made by the ordinary skilled in the art without departing from the spirit and scope of the detailed description and appended claims.

What is claimed is:

1. A method of manufacturing a flash memory device, the method comprising:
   forming a tunnel oxide layer and a conductive layer for a floating gate on a semiconductor substrate;
   etching a portion of the conductive layer, the tunnel oxide layer and the semiconductor substrate to form trenches;
   gap-filling the trenches with an insulating layer to form isolation layers;
   polishing the isolation layers to expose a top surface of the conductive layer;
   etching the isolation layers to lower an effective field oxide height (EFH) to a top surface of the tunnel oxide layer;
   forming sidewalls on sidewall parts of the conductive layer;
   etching the isolation layers up to a region below the tunnel oxide layer using the sidewall parts as masks;
   stripping the sidewall parts and performing an etch process in order to widen an opening part of each isolation layer and increase the height of the sidewalls of the exposed conductive layer; and
   forming a dielectric layer and a second conductive layer for a control gate on the entire surface.

2. The method of claim 1, wherein the conductive layer is formed using a polysilicon layer.

3. The method of claim 1, wherein the sidewall parts are formed using an amorphous carbon layer.

4. The method of claim 1, wherein in the etching of the isolation layers to the region below the tunnel oxide layer using the sidewall parts as masks, each isolation layer is etched to a thickness of about 50 Å to about 1000 Å.

5. The method of claim 1, wherein the isolation layers are formed using a HDP oxide layer.

6. The method of claim 1, wherein polishing the isolation layer is performed by using a chemical mechanical polishing (CMP) process.

7. The method of claim 1, wherein the dielectric layer comprises an ONO structure in which a first oxide layer, a nitride layer, and a second oxide layer are sequentially laminated.

8. The method of claim 1, wherein the second conductive layer is formed using a polysilicon layer.

* * * * *